US008803100B2

(12) United States Patent
Yamada

(10) Patent No.: US 8,803,100 B2
(45) Date of Patent: Aug. 12, 2014

(54) RADIATION IMAGE PICKUP APPARATUS AND RADIATION IMAGE PICKUP/DISPLAY SYSTEM

(75) Inventor: Yasuhiro Yamada, Kanagawa (JP)

(73) Assignee: Sony Corporation (JP)

( * ) Notice: Subject to any disclaimer, the term of this patent is extended or adjusted under 35 U.S.C. 154(b) by 227 days.

(21) Appl. No.: 13/328,925

(22) Filed: Dec. 16, 2011

(65) Prior Publication Data

US 2012/0193542 A1    Aug. 2, 2012

(30) Foreign Application Priority Data

Jan. 31, 2011    (JP) .................................. 2011-017789

(51) Int. Cl.
    *G01T 1/20*    (2006.01)
    *G01T 1/24*    (2006.01)
(52) U.S. Cl.
    USPC .................................................... 250/370.11
(58) Field of Classification Search
    USPC ............. 250/370.01, 370.08, 370.09, 370.11
    See application file for complete search history.

(56) References Cited

U.S. PATENT DOCUMENTS

2006/0033032 A1* 2/2006 Inoue et al. .............. 250/370.11
2007/0297567 A1* 12/2007 Takenaka et al. ............. 378/98.2
2011/0164724 A1* 7/2011 Ohta et al. ....................... 378/62

FOREIGN PATENT DOCUMENTS

JP    3029873    2/2000
JP    3077941    6/2000

* cited by examiner

*Primary Examiner* — Mark R Gaworecki
(74) *Attorney, Agent, or Firm* — Sheridan Ross P.C.

(57) ABSTRACT

There are provided a radiation image pickup apparatus that may suppress deterioration of the transistor characteristic in the circuit in the periphery of the pixel section, and a radiation image pickup/display system including the apparatus. The radiation image pickup apparatus includes a pixel section provided on a substrate and having photoelectric conversion elements, a circuit section provided in the periphery of the pixel section on the substrate to drive the pixel section, and a wavelength conversion layer provided on the pixel section to convert a wavelength of radiation into a predetermined wavelength within a sensitivity range of the photoelectric conversion elements. The circuit section is provided in a region not facing an end of the wavelength conversion layer.

16 Claims, 8 Drawing Sheets

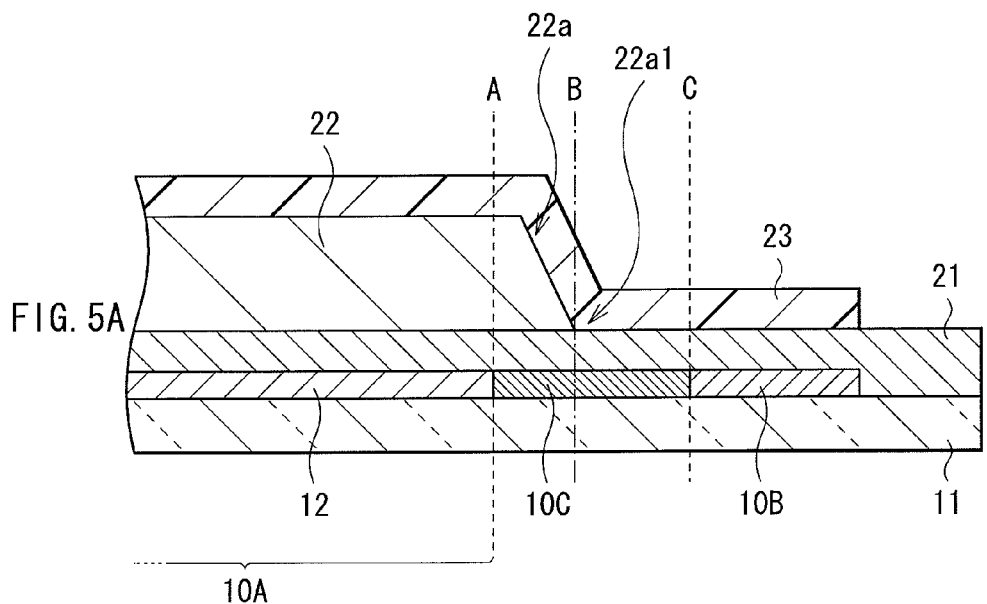
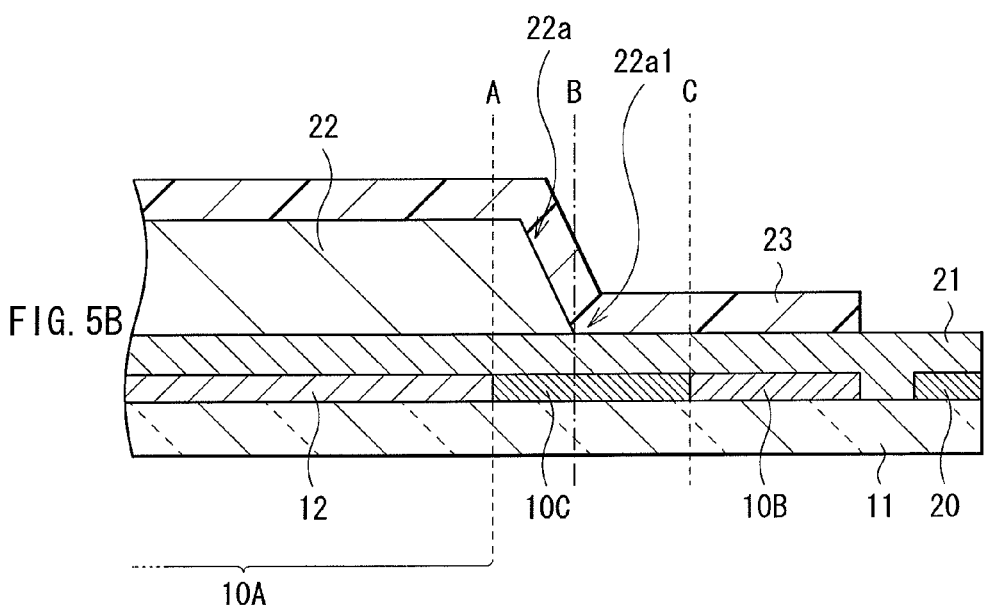

RADIATION IMAGE PICKUP APPARATUS AND RADIATION IMAGE PICKUP/DISPLAY SYSTEM

CROSS REFERENCES TO RELATED APPLICATIONS

The present application claims priority to Japanese Priority Patent Application JP 2011-017789 filed in the Japan Patent Office on Jan. 31, 2011, the entire content of which is hereby incorporated by reference.

BACKGROUND

The present disclosure relates to a radiation image pickup apparatus suitable for, for example, X-ray photography for medical use and a non-destructive inspection, and to a radiation image pickup/display system including the apparatus.

In recent years, a CCD (Charge Coupled Device) image sensor or a CMOS (Complementary Metal Oxide Semiconductor) image sensor has been largely used for acquiring an image as an electric signal (image pickup method using photoelectric conversion). An image pickup area of such an image sensor is limited by a size of a crystalline substrate (silicon wafer). However, increase in the image pickup area is demanded particularly in a medical field using X-rays for image pickup. In addition, high video performance is increasingly demanded in the medical field.

For example, the following radiation image pickup apparatus is used for a chest X-ray photography apparatus to directly generate electric signals as image data without using radiation photographic films. Specifically, in the radiation image pickup apparatus, a pixel section including photoelectric conversion elements such as photodiodes is provided on a substrate, and a wavelength conversion layer including a phosphor material is formed on the pixel section. In such a configuration, radiation is input to the apparatus and converted into visible light by the wavelength conversion layer, and then the visible light is received by each of the photoelectric conversion elements, and an electric signal corresponding to the amount of the received light is read out.

In such a radiation image pickup apparatus including the wavelength conversion layer, the phosphor material used for the layer deteriorates due to penetrated water, as generally known. In some proposed methods, a protective layer is provided over the wavelength conversion layer to seal the layer as disclosed in Japanese Patent Nos. 3029873 and 3077941, for example.

SUMMARY

On the other hand, the above radiation image pickup apparatus has a circuit section (driver circuit) for driving the pixel section. The circuit section and the pixel section may not be integrated on the same substrate in the case of using amorphous silicon for a semiconductor material of transistors. The sections, however, may be integrated in the case of using polycrystalline silicon or microcrystalline silicon. For example, the circuit section may be formed in the periphery of the pixel section on the substrate.

Unfortunately, when the circuit section is formed in the periphery of the pixel section on the substrate as described above, the following difficulty occurs. Specifically, the phosphor material used for the wavelength conversion layer may deteriorate due to the penetrated water as described above, causing deterioration of a transistor characteristic in the circuit in the periphery of the pixel section.

It is desirable to provide a radiation image pickup apparatus that may suppress deterioration of the transistor characteristic in the circuit in the periphery of the pixel section, and provide a radiation image pickup/display system including the apparatus.

A first radiation image pickup apparatus according to an embodiment of the disclosure includes a pixel section provided on a substrate and having photoelectric conversion elements; a circuit section provided in the periphery of the pixel section on the substrate to drive the pixel section; and a wavelength conversion layer provided on the pixel section to convert a wavelength of radiation into a certain wavelength within a sensitivity range of the photoelectric conversion elements. The circuit section is provided in a region being not opposed to an end of the wavelength conversion layer.

A second radiation image pickup apparatus according to an embodiment of the disclosure includes a pixel section provided on a substrate and having photoelectric conversion elements; a circuit section provided in the periphery of the pixel section on the substrate to drive the pixel section; a wavelength conversion layer provided on the pixel section to convert a wavelength of radiation into a certain wavelength within a sensitivity range of the photoelectric conversion elements; and an electric shield layer provided on the circuit section.

A first radiation image pickup/display system according to an embodiment of the disclosure includes an image pickup apparatus (the first radiation image pickup apparatus according to the embodiment of the disclosure) acquiring an image based on radiation; and a display unit displaying an image acquired by the image pickup apparatus.

A second radiation image pickup/display system according to an embodiment of the disclosure includes an image pickup apparatus (the second radiation image pickup apparatus according to the embodiment of the disclosure) acquiring an image based on radiation; and a display unit displaying an image acquired by the image pickup apparatus.

In the first radiation image pickup apparatus and the first radiation image pickup/display system according to the embodiments of the disclosure, radiation is input to the apparatus and converted into light having a predetermined wavelength by the wavelength conversion layer, and then the wavelength-converted light is received by the photoelectric conversion element, and thus an electric signal (image pickup data) is produced in correspondence to the quantity of the received light. If water enters the wavelength conversion layer, a threshold voltage of each transistor on the substrate may shift due to an effect of fixed charge. Such ionization of the wavelength conversion layer tends to occur from an end of the layer. The circuit section is provided in the region being not opposed to the end of the wavelength conversion layer, so that transistors in the circuit section are hardly affected by the ionization, leading to suppression of shift of the threshold voltage.

In the second radiation image pickup apparatus and the second radiation image pickup/display system according to the embodiments of the disclosure, radiation is input to the apparatus and converted into light having a predetermined wavelength by the wavelength conversion layer, and then the wavelength-converted light is received by the photoelectric conversion element, and thus an electric signal (image pickup data) is produced in correspondence to the quantity of the received light. If water enters the wavelength conversion layer, a threshold voltage of each transistor on the substrate tends to shift due to an effect of fixed charge. The electric shield layer is provided on the circuit section, so that transistors in the circuit section are hardly affected by the ionization, leading to suppression of shift of the threshold voltage.

According to the first radiation image pickup apparatus and the first radiation image pickup/display system according to the embodiments of the disclosure, the wavelength conversion layer converting a wavelength of radiation into the predetermined wavelength is provided on the pixel section, and the circuit section is provided in the region being not opposed to the end of the wavelength conversion layer in the periphery of the pixel section, so that shift of the threshold voltage of each transistor may be suppressed in the circuit section. Consequently, deterioration of the transistor characteristic may be suppressed in the circuit in the periphery of the pixel section.

According to the second radiation image pickup apparatus and the second radiation image pickup/display system according to the embodiments of the disclosure, the wavelength conversion layer converting a wavelength of radiation into the predetermined wavelength is provided on the pixel section, and the electric shield layer is provided on the circuit section disposed in the periphery of the pixel section, so that shift of the threshold voltage of each transistor may be suppressed in the circuit section. Consequently, deterioration of the transistor characteristic may be suppressed in the circuit in the periphery of the pixel section.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

FIGS. 5A and 5B are schematic views each showing a sectional structure of the periphery of the pixel section shown in FIG. 1, where FIG. 5A shows a sectional structure along a I-I line in FIG. 1, and FIG. 5B shows a sectional structure along a II-II line in FIG. 1.

DETAILED DESCRIPTION

Embodiments of the disclosure are described below with reference to the attached drawings. Description is made in the following order.

1. First embodiment (an example where a circuit section is disposed on an outer side from an end of a scintillator layer).
2. Modification 1 (an example where the circuit section is disposed in an inner side from the end).
3. Second embodiment (an example where an electric shield layer is provided on the circuit section).
4. Application example (an example of radiation image pickup/display system).

First Embodiment

[Configuration]

Figure 1:
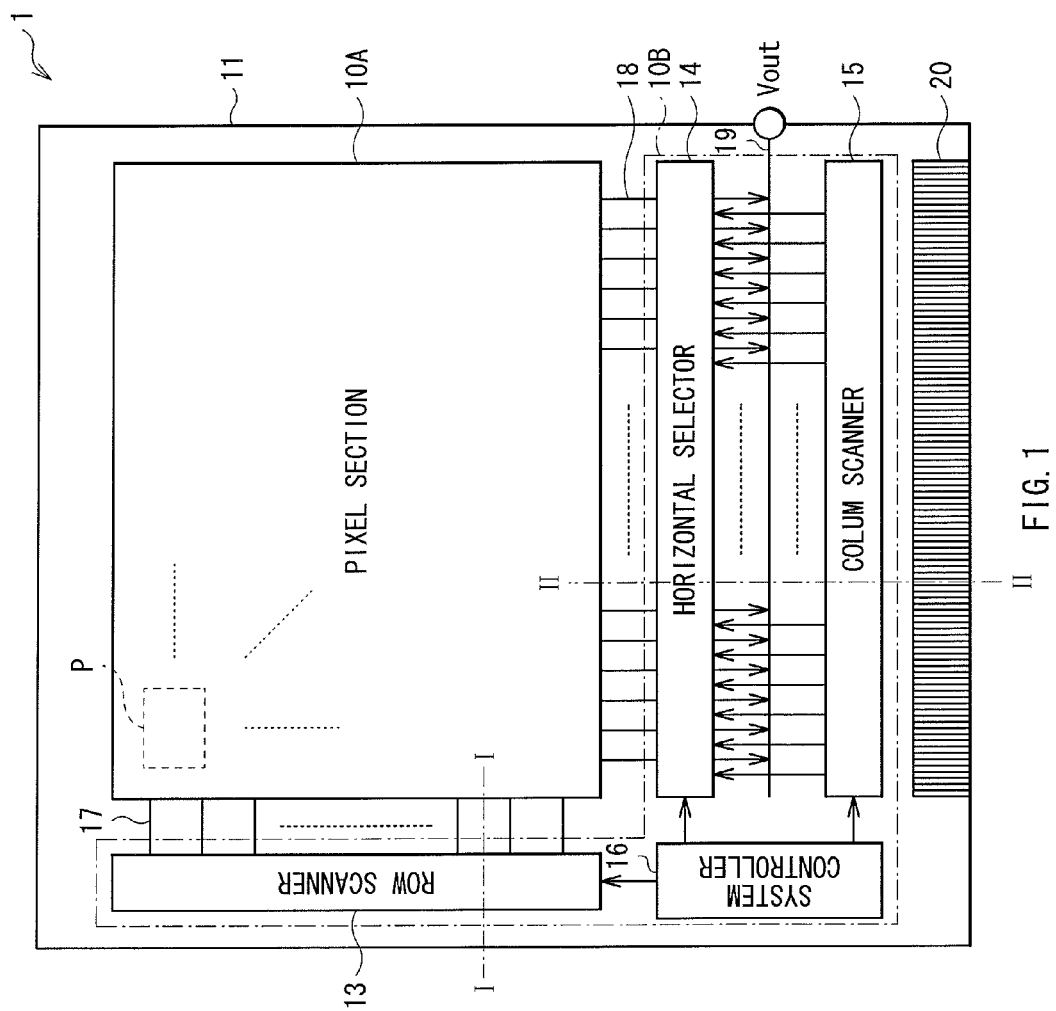
FIG. 1 is a functional block diagram showing a general configuration of a radiation image pickup apparatus according to a first embodiment of the disclosure.

FIG. 1 shows a general configuration of a radiation image pickup apparatus (radiation image pickup apparatus 1) according to an embodiment of the disclosure. The radiation image pickup apparatus 1 converts a wavelength of the radiation typically including α-rays, β-rays, γ-rays, or X-rays into a predetermined wavelength and receives the light with the converted wavelength, and thus reads image information based on the radiation. The radiation image pickup apparatus 1 is preferably used as an X-ray image pickup apparatus for medical use and nondestructive inspection such as baggage inspection.

The radiation image pickup apparatus 1 has a pixel section 10A on a substrate 11 and has a circuit section 10B in the periphery of the pixel section 10A to drive the pixel section 10A. A not-shown wavelength conversion layer (scintillator layer 22 described later) is provided on the pixel section 10A. Bonding pads 20 for external connection are provided on an end of the substrate 11.

The pixel section 10A corresponds to an image pickup area of the radiation image pickup apparatus 1. In the pixel section 10A, unit pixels P, which may be simply described "pixels" below, are two-dimensionally arranged in a matrix, each pixel including a photoelectric conversion element (photodiode 111A described later) that generates a photo-charge having an amount corresponding to the quantity of incident light and internally stores the photo-charge. The unit pixel P is provided with, for example, two lines (specifically, a row selection line and a reset control line) as a pixel drive line 17 for each of pixel rows.

Furthermore, the pixel section 10A has the pixel arrangement in a matrix, in which pixel drive lines 17 are wired in a row direction (an arrangement direction of pixels in a pixel row) for each of pixel rows, and vertical signal lines 18 are wired in a column direction (an arrangement direction of pixels in a pixel column) for each of pixel columns. The pixel drive lines 17 transmit drive signals for reading signals from the pixels. While each pixel drive line 17 is shown as a single line in FIG. 1, this is not limitative. One end of the pixel drive line 17 is connected to an output end of a row scanner 13 in correspondence to each row. A configuration of the pixel section 10A is described later.

The circuit section 10B includes, for example, the row scanner 13, a horizontal selector 14, a column scanner 15, and a system controller 16. Transistors to which a DC voltage is to be applied are included in the column scanner 15, for example.

The row scanner 13, which includes a shift resistor, an address decoder, and the like, acts as a pixel driver that drives the pixels P in the pixel section 10A in rows, for example. The row scanner 13 selectively scans the pixel rows, and each unit pixel in the selected row outputs a signal which is then supplied to the horizontal selector 14 through each of the vertical signal lines 18. The horizontal selector 14 includes amplifiers, horizontal selection switches, and the like provided for each of the vertical signal lines 18.

The column scanner 15, which includes a shift resistor, an address decoder, and the like, sequentially scans and drives the horizontal selection switches of the horizontal selector 14. The column scanner 15 selectively scans the selection switches in this way, and thus signals from the pixels are transmitted through the vertical signal lines 18 and sequentially output to horizontal signal lines 19, and output to the outside of the substrate 11 through the horizontal signal lines 19.

Such a circuit portion including the row scanner 13, the horizontal selector 14, the column scanner 15, and the horizontal signal lines 19 may be formed on the substrate 11, or may be incorporated in an external control IC. Alternatively, the circuit portion may be formed on another substrate connected through a cable or the like.

The system controller 16 receives a clock or data instructing an operation mode from the outside of the substrate 11, and outputs data such as inside information of the radiation image pickup apparatus 1. The system controller 16 further includes a timing generator that generates various timing signals, and performs drive control of the peripheral circuit including the row scanner 13, the horizontal selector 14, and the column scanner 15 on the basis of the timing signals.

[Detailed Configuration of Pixel Section 10A]

Figure 2:
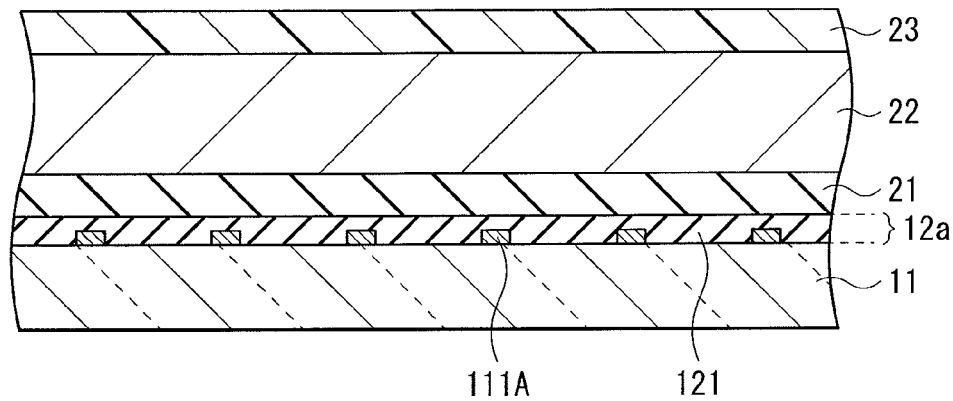
FIG. 2 is a schematic view showing a sectional structure of a pixel section shown in FIG. 1.

FIG. 2 shows a sectional structure of the pixel section 10A. In the pixel section 10A, a photoelectric conversion layer 12a is provided on the substrate 11, photodiodes 111A are provided for each of the pixels P in the layer 12a, and an insulating film 12 including an interlayer insulating film described later is formed on the photodiodes 111A. A planarization film 21 including an organic material or silicon nitride, for example, is further provided on the insulating film 12. A not-shown protective film may be provided on the planarization film 21, or the planarization film 21 may serve also as the protective film. A scintillator layer 22 (wavelength conversion layer) is provided on the planarization film 21, and a protective film 23 is formed over the scintillator layer 22. Configurations of major parts of the pixel section 10A are specifically described below.

(Circuit Configuration of Unit Pixel P)

Figure 3:
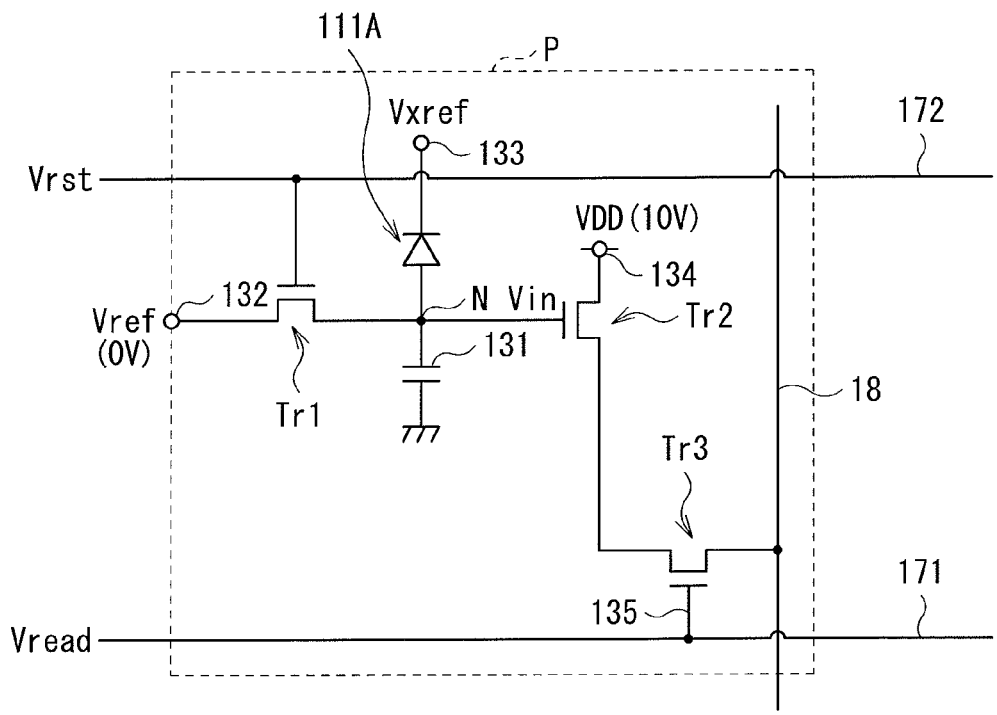
FIG. 3 shows an exemplary pixel circuit configuration (with an active drive method) of a unit pixel shown in FIG. 2.

FIG. 3 shows an exemplary circuit configuration of the unit pixel P including the photodiode 111A. The unit pixel P includes the photodiode 111A (photoelectric conversion element), transistors Tr1, Tr2 and Tr3, the vertical signal line 18, and a row selection line 171 and a reset control line 172 as the pixel drive line 17.

The photodiode 111A is, for example, a PIN (Positive Intrinsic Negative Diode) photodiode having a sensitivity range, for example, in a visible range (the light-receiving wavelength range is in the visible range). The photodiode 111A generates a signal charge having an amount corresponding to the quantity of incident light (the quantity of received light) upon application of the reference potential Vxref to a cathode (terminal 133) of the photodiode. An anode of the photodiode 111A is connected to a storage node N. The storage node N has a capacitive component 131, and thus the signal charge generated by the photodiode 111A is stored in the storage node N. The photodiode 111A may be connected between the storage node N and the ground (GND).

The transistors Tr1, Tr2 and Tr3 (pixel transistors) are all N-channel field effect transistors including, for example, silicon-based semiconductor such as microcrystalline silicon or polycrystalline silicon. Alternatively, the transistors may include oxide semiconductor such as indium-gallium-zinc oxide (InGaZnO) or zinc oxide (ZnO).

The transistor Tr1 is a reset transistor connected between a terminal 132, to which the reference potential Vref is to be supplied, and the storage node N. The transistor Tr1 is turned on in response to a reset signal Vrst and thus resets the potential of the storage node N to the reference potential Vref. The transistor Tr2 is a read transistor of which the gate is connected to the storage node N, and of which the terminal 134 (drain) is connected to a power source VDD. The transistor Tr2 receives at the gate the signal charge generated by the photodiode 111A, and outputs a signal voltage corresponding to the signal charge. The transistor Tr3, which is a row-selection transistor connected between a source of the transistor Tr2 and the vertical signal line 18, is turned on in response to a row scan signal Vread and thus outputs the signal from the transistor Tr2 to the vertical signal line 18. The transistor Tr3 may be connected between the drain of the transistor Tr2 and the power source VDD.

(Sectional Configuration of Photodiode 111A and of Transistor 111B)

Figure 4:
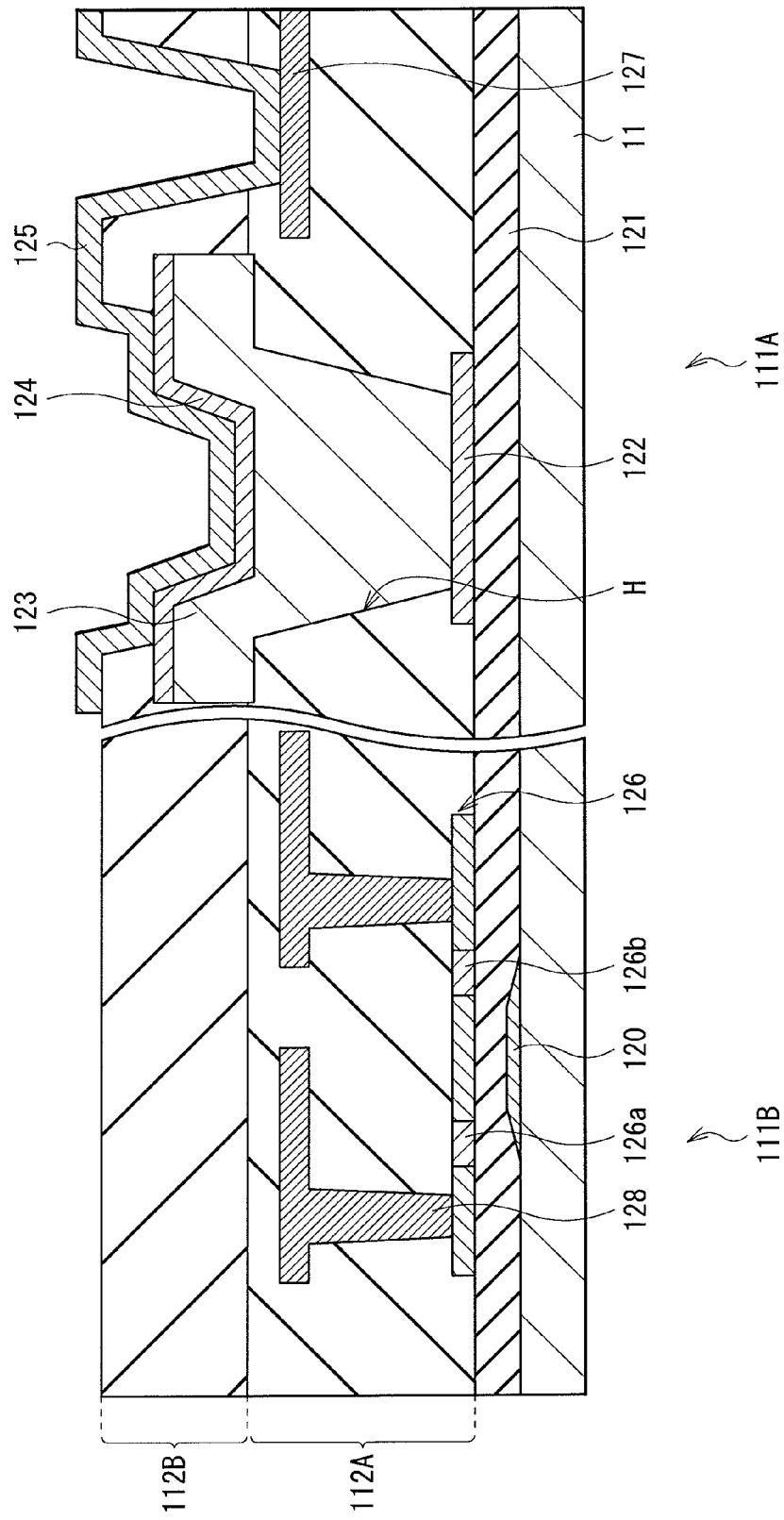
FIG. 4 is a schematic view showing a sectional structure of each of a photodiode and a transistor shown in FIG. 3.

FIG. 4 shows an exemplary sectional configuration of each of the photodiode 111A and a transistor 111B. The transistor 111B shown in FIG. 4 corresponds to any of the transistors disposed in the circuit section 10B and the transistors Tr1, Tr2 and Tr3 in the pixel section 10A.

The photodiode 111A has a p-type semiconductor layer 122 in a selective region on a gate insulating film 121 on the substrate 11 including glass or the like. On the substrate 11 (specifically, on the gate insulating film 121), a first interlayer insulating film 12A having a contact hole (through hole) H is provided to face the p-type semiconductor layer 122. In the contact hole H, an i-type semiconductor layer 123 is provided on the p-type semiconductor layer 122, and an n-type semiconductor layer 124 is provided on the i-type semiconductor layer 123. The n-type semiconductor layer 124 is connected to an upper electrode 125 through a contact hole of a second interlayer insulating film 12B. While the p-type semiconductor layer 122 is provided on a substrate side (lower side) and the n-type semiconductor layer 124 is provided on an upper side, the respective layers may be provided on opposite sides, namely, the n-type and the p-type semiconductor layers are provided on the lower side (substrate side) and on the upper side, respectively.

The gate insulating film 121 is, for example, formed as the same layer as a gate insulating film of the transistor 111B, and includes a silicon oxide ($SiO_2$) film or stacked insulating films of a silicon oxide film, a silicon oxynitride film, and a silicon nitride film, for example.

The p-type semiconductor layer 122 acts as a P+ region including, for example, polycrystalline silicon (polysilicon) or microcrystalline silicon doped with, for example, boron (B), and has a thickness of 40 nm to 50 nm both inclusive, for example. The p-type semiconductor layer 122, for example, serves also as a lower electrode (anode) for reading the signal charge, and is connected to the storage node N. Alternatively, the p-type semiconductor layer 122 acts as the storage node N for storing charge.

The first interlayer insulating film 12A includes stacked insulating films of a silicon oxide film and a silicon nitride film, for example. The first interlayer insulating film 12A is, for example, formed as the same layer as an interlayer insulating film of the transistor 111B. The second interlayer insulating film 12B includes a silicon oxide film, for example. The first and second interlayer insulating films 12A and 12B correspond to the described insulating film 12.

The i-type semiconductor layer 123 is a semiconductor layer exhibiting the middle conductivity between the p-type and the n-type, for example, a non-doped intrinsic semiconductor layer, and includes, for example, amorphous silicon. Thickness of the i-type semiconductor layer 123 is, for example, 400 nm to 1000 nm both inclusive, and photosensitivity of the layer 123 may be increased with increase in thickness. The n-type semiconductor layer 124 includes, for example, amorphous silicon, and forms an n+ region. Thickness of the n-type semiconductor layer 124 is, for example, 10 nm to 50 nm both inclusive.

The upper electrode 125 (cathode) supplies the reference potential for photoelectric conversion, and includes, for example, a transparent conductive film such as an ITO (Indium Tin Oxide) film. The upper electrode 125 is connected with a power line 127 for supplying a voltage to the upper electrode 125. The power line 127 includes a material having a resistance lower than that of the upper electrode 125, for example, Ti, Al, Mo, W, or Cr.

In the transistor 111B, a gate electrode 120 including Ti, Al, Mo, W, Cr, or the like is formed on the substrate 11, and a gate insulating film 121 is formed on the gate electrode 120. A semiconductor layer 126 is formed on the gate insulating film 121, where LDD (Lightly Doped Drain) 126a or 126b is provided between a channel region and a drain/source region in order to reduce a leakage current. The semiconductor layer 126 includes, for example, polycrystalline silicon, low-temperature polycrystalline silicon, or microcrystalline silicon. A wiring layer 128, which includes a read signal line and other lines made of Ti, Al, Mo, W, Cr, or the like, is formed in the first interlayer insulating film 12A provided on the semiconductor layer 126.

(Scintillator Layer 22)

The scintillator layer 22 converts a wavelength of radiation into a certain wavelength within a sensitivity range of the photodiode 111A. A material of the scintillator layer 22 includes, for example, a phosphor that converts an X-ray into visible light. Such a phosphor includes, for example, CsI, $Gd_2O_2S$, BaFX (X represents Cl, Br, I or the like). A thickness of the scintillator layer 22 is, for example, 400 μm to 600 μm both inclusive.

The scintillator layer 22 includes the phosphor material which tends to deteriorate due to water. Moisture absorbability of the scintillator layer is different depending on kinds of the phosphor material, and may vary depending on tube voltages. Among the above-described phosphor materials, CsI is particularly high in moisture absorbability and thus easily ionized. It is therefore desirable to provide an organic protective film 23 including, for example, Parylene C on the scintillator layer 22.

As described above, in the embodiment, the circuit section 10B is provided in the periphery of the pixel section 10A on the substrate 11, and the scintillator layer 22 is provided for wavelength conversion on the pixel section 10A. In the embodiment having such a configuration, the circuit section 10B is provided in the following arrangement relationship with an end 22a of the scintillator layer 22.

(Arrangement Relationship of Circuit Section 10B to Scintillator Layer)

FIGS. 5A and 5B each show a sectional structure of the periphery of the pixel section 10A. FIG. 5A shows a sectional structure along a I-I line in FIG. 1, and FIG. 5B shows a sectional structure along a II-II line in FIG. 1. The wiring layer 10C (corresponding to the pixel drive lines 17 and the vertical signal lines 18) is disposed between the pixel section 10A and the circuit section 10B on the substrate 11. In the following description, a position of a boundary between the pixel section 10A and the wiring layer 10C (an end position of the pixel section 10A) is mentioned as "A", a position of a boundary between the wiring layer 10C and the circuit section 10B (an end position of the circuit section 10B on a pixel section 10A side) is mentioned as "C", and a position of a foot 22a1 of the end 22a of the scintillator layer 22 is mentioned as "B".

In this way, the circuit section 10B is disposed in a region being not opposed to the end 22a (a region other than a portion directly below the end 22a) of the scintillator layer 22. Specifically, the circuit section 10B is disposed on an outer side (a side opposite to the pixel section 10A) from the end 22a of the scintillator layer 22 on the substrate 11. Specifically, the end 22a has a tapered shape, and the circuit section 10B is disposed on an outer side from the foot 22a1 of the tapered shape. Specifically, the pixel section 10A, the circuit section 10B, and the scintillator layer 22 are disposed such that the position B exists between the positions A and C.

[Manufacturing Method]

The above-described radiation image pickup apparatus 1 may be manufactured in the following way, for example. Specifically, first, the substrate 11 including, for example, glass is prepared, and then the pixel section 10A and the circuit section 10B are formed on the substrate 11 by a known thin-film formation process, and then a planarization film material including, for example, an organic material is applied thereon by, for example, spin coating, and then the applied material is baked, so that the planarization film 21 is formed. In the case of using silicon nitride for the planarization film material, the planarization film 21 is formed by a CVD (Chemical Vapor Deposition) method, for example. After that, the scintillator layer 22 including the above-described material is formed by an evaporation method, for example, on the planarization film 21. A mask having an opening smaller than the area of the circuit section 10B is used for the evaporation. Specifically, the evaporation is performed such that an edge of the opening of the mask is situated between the end position A of the pixel section 10A and the end position C of the circuit section 10B on the pixel section 10A side. Finally, the protective film including Parylene C is formed by a CVD method, for example, on the scintillator layer 22.

[Operation and Effects]

Operation and effects of the embodiment are described with reference to FIGS. 1 to 6. The radiation image pickup apparatus 1 receives radiation that has been emitted from a not-shown radiation (for example, X-ray) source and passed through an object (a detection object), and converts a wavelength of the radiation into a predetermined wavelength and then performs photoelectric conversion on such wavelength-converted light, and thus produces an image of the object as an electric signal. Specifically, radiation is input to the radiation image pickup apparatus 1 and passes through the protective film 23, and then the radiation is converted by the scintillator layer 22 into light having a wavelength within a sensitivity range (here, visible range) of the photodiode 111A. The light is then output from the scintillator layer 22 and then passes through the planarization film 21, and is then received by the photodiode 111A.

At this time, when a predetermined electric potential is applied, for each of the unit pixels P, to the photodiode 111A from a not-shown power line through the upper electrode 125, the light input from the upper electrode 125 side, for example, is converted into a signal charge having an amount corresponding to the quantity of light received by the photodiode (photoelectric conversion). The signal charge generated through the photoelectric conversion is output as a photocurrent from the p-type semiconductor layer 122 side.

Specifically, the charge generated through the photoelectric conversion in the photodiode 111A is collected by a storage layer (the p-type semiconductor layer 122 and the storage node N). The charge is then read as a current from the storage layer and supplied to a gate of the transistor Tr2 (read transistor). The transistor Tr2 outputs a signal voltage corresponding to the above-described signal charge. The signal output from the transistor Tr2 is output to (read by) the vertical signal line 18 upon turn-on of the transistor Tr3 in response to a row scan signal Vread. The read signal is then output to the outside through the horizontal selector 14. Consequently, image data Dout are provided.

While the scintillator layer 22 is used to convert the wavelength of the input radiation (X-ray) in the embodiment as described above, the scintillator layer 22 is sensitive to water, and has a property of ionizing due to absorbed water. Such ionization of the scintillator layer 22 may occur even if the protective film 23 is formed on the scintillator layer 22. In particular, since adhesion of the scintillator layer to the protective film 23 tends to be reduced in the end 22a of the scintillator layer 22, water tends to enter from the end 22a, leading to ionization of the scintillator layer 22 near the end 22a.

Figure 6:
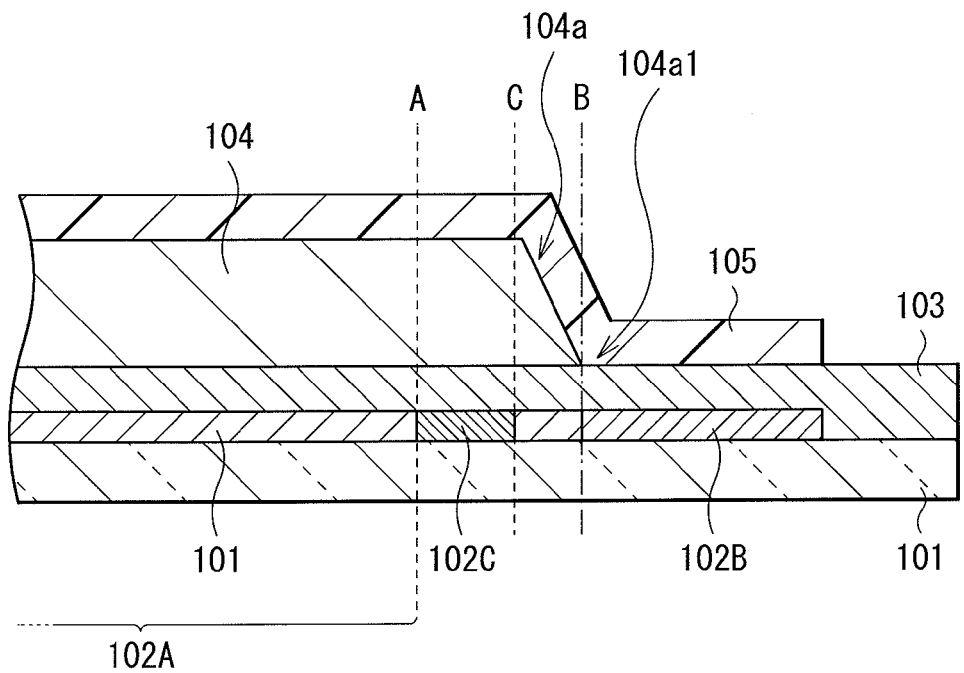
FIG. 6 is a schematic view showing a sectional structure of the periphery of a pixel section according to a comparative example.

FIG. 6 shows a sectional structure of the periphery of the pixel section according a comparative example of the embodiment. Also in the comparative example, a pixel section 102A, a circuit section 102B, and a wiring layer 102C are provided on a substrate 101, and a planarization film 103 is formed so as to cover those. A scintillator layer 104 is provided on the planarization film 103, and a protective film 105 is provided over the scintillator layer 104. In the comparative example, however, the circuit section 102B is disposed to face an end 104a (directly below the end 104a) of the scintillator layer 104. Specifically, an end position C of the circuit section 102B on a pixel section 102A side is set on an inner side from a position B of a foot 104a1 of the scintillator layer 104.

In the comparative example, water enters through a space near the end 104a due to reduction in adhesion of the protective film 105, so that the scintillator layer 104 is ionized as described above, resulting in the following disadvantage. Specifically, impurity ions due to ionization of the phosphor material or ions caused by water adhere to the protective film 105 and the planarization film 103, and thus the films are charged and vertically polarized. This leads to formation of a back channel in the transistor, causing variation of a threshold voltage. Such deterioration of a transistor characteristic is notably found in a transistor in the circuit section 102B rather than in the pixel section 102A. The reason for this is as follows. While the pixel section 102A is driven mainly by AC (Alternating Current) voltage, the circuit section 102B has a portion to which DC (Direct Current) voltage is continuously applied and thus a constant voltage is applied. Consequently, the circuit section 102B tends to be affected by the above-described ionization, leading to deterioration of the transistor characteristic. Since the circuit section 102B is disposed to face the end 104a of the scintillator layer 104 in the comparative example, a threshold voltage of the transistor in the circuit section 102B varies due to the effect of the ionization.

In the embodiment, as shown in FIGS. 5A and 5B, the circuit section 10B, which tends to be affected by ionization, is disposed in a region not facing the end 22a of the scintillator layer 22, as described above. This results in suppression of storage of fixed charge in the circuit section 10B even if ionization occurs near the end 22a of the scintillator layer 22. Consequently, the circuit section 10B is hardly affected by the above-described ionization, leading to suppression of shift of the threshold voltage of the transistor in the section.

As described above, in the embodiment, the scintillator layer 22 is provided on the pixel section 10A corresponding to an image pickup area, and the circuit section 10B is disposed in the region, which does not face the end 22a of the scintillator layer 22, in the periphery of the pixel section 10A. This enables suppression of shift of the threshold voltage of the transistor caused by ionization in the circuit section 10B even if the scintillator layer 22 is ionized from the end 22a due to absorbed water. Consequently, deterioration of a transistor characteristic may be suppressed in the circuit in the periphery of the pixel section.

[Modification 1]

Figure 7:
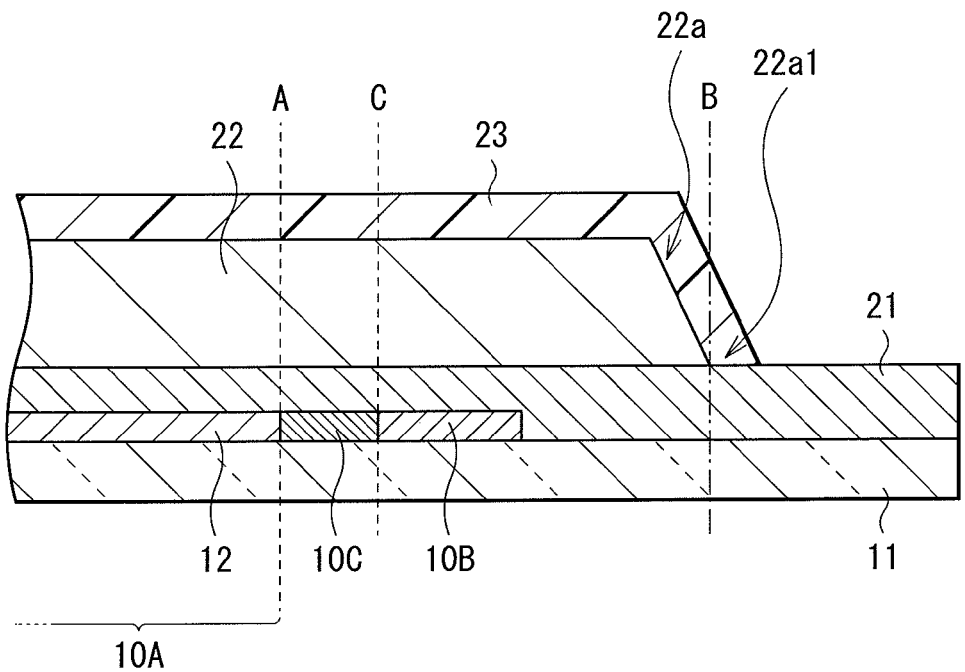
FIG. 7 is a schematic view showing a sectional structure of the periphery of a pixel section according to modification 1.

FIG. 7 shows an arrangement relationship between the circuit section 10B and the scintillator layer 22 according to a modification (modification 1) of the first embodiment. Also in this modification, as in the first embodiment, a pixel section 10A, a circuit section 10B, and a wiring layer 10C are provided on a substrate 11, and a scintillator layer 22 and a protective film 23 are formed on the pixel section 10. In the following, the same reference numerals are assigned to the same components as those in the first embodiment without duplicated explanation.

Incidentally, the modification is different from the first embodiment in arrangement of the circuit section 10B with respect to an end 22a of the scintillator layer 22. In the modification, the circuit section 10B is disposed on an inner side (a pixel section 10A side) from the end 22a of the scintillator layer 22. Specifically, the pixel section 10A, the circuit section 10B, and the scintillator layer 22 are disposed such that the position C exists between the positions A and B. The circuit section 10B is desirably disposed such that the circuit section 10B as a whole does not overlap the end 22a (the circuit section 10B faces a flat surface portion of the scintillator layer 22).

In this configuration, even if the scintillator layer 22 is ionized at the end 22a, the circuit section is hardly affected by the ionization as in the first embodiment, and thus the same advantage as in the first embodiment may be obtained. In this way, the circuit section 10B is not limitedly disposed in the outer region from the end 22a as described in the first embodiment, and may be disposed in any region not facing the end 22a of the scintillator layer 22, for example, in the inner region from the end 22a as in the modification.

Second Embodiment

Figure 8A:
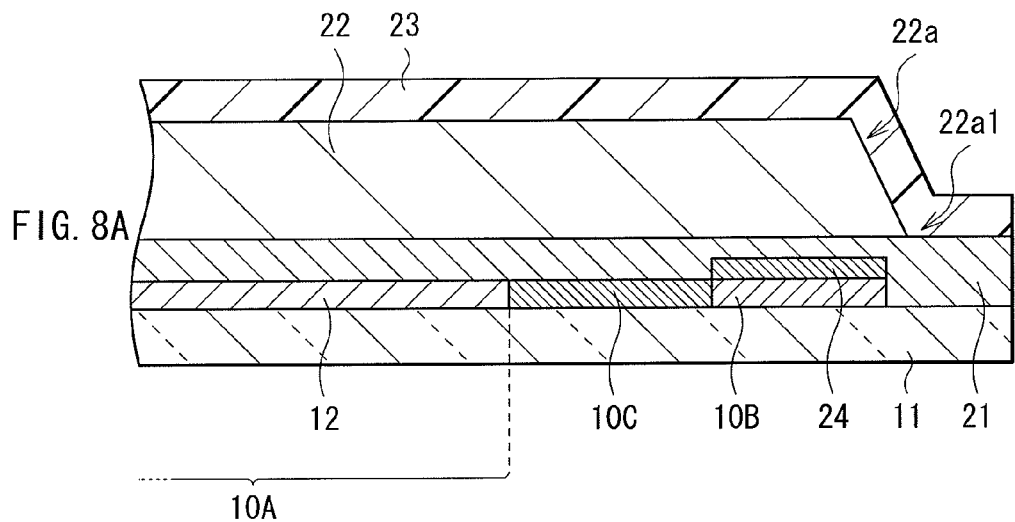
FIGS. 8A and 8B are schematic views each showing a sectional structure of the periphery of a pixel section according to a second embodiment of the disclosure.
Figure 8B:
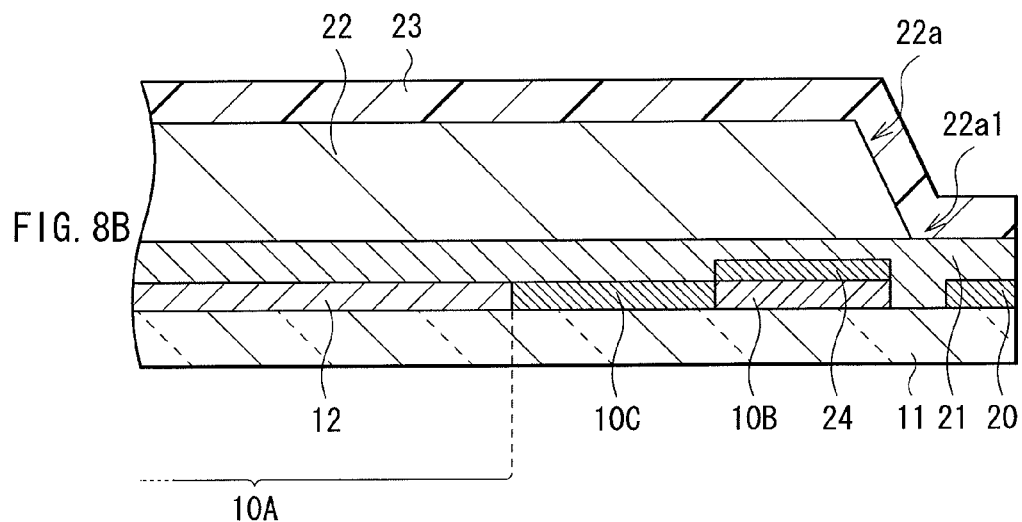

FIGS. 8A and 8B each show a sectional structure of the periphery of a pixel section 10A according to a second embodiment of the disclosure. FIG. 8A shows a sectional structure along the I-I line in FIG. 1, and FIG. 8B shows a sectional structure along the II-II line. In the embodiment, the pixel section 10A and a circuit section 10B are provided on a substrate 11, and a scintillator layer 22 is provided on the pixel section 10A, as in the first embodiment. The embodiment, however, is different from the first embodiment in an arrangement relationship between the circuit section 10B and the scintillator layer 22. In addition, the embodiment is different from the first embodiment in that a shield layer 24 is provided on the circuit section 10B. In the following, the same reference numerals are assigned to the same components as those in the first embodiment without duplicated explanation.

Specifically, in the embodiment, the electric shield layer 24 is provided on the circuit section 10B which is thus disposed at any place. While the shield layer 24 may be configured of any conductive material, the shield layer 24 is configured of, for example, the same material as that of the upper electrode 125 of the photodiode 111A in the pixel section 10A, for example, a transparent conductive film including ITO. The shield layer 24 may be formed by the same process as that of the upper electrode 125.

Figure 9:
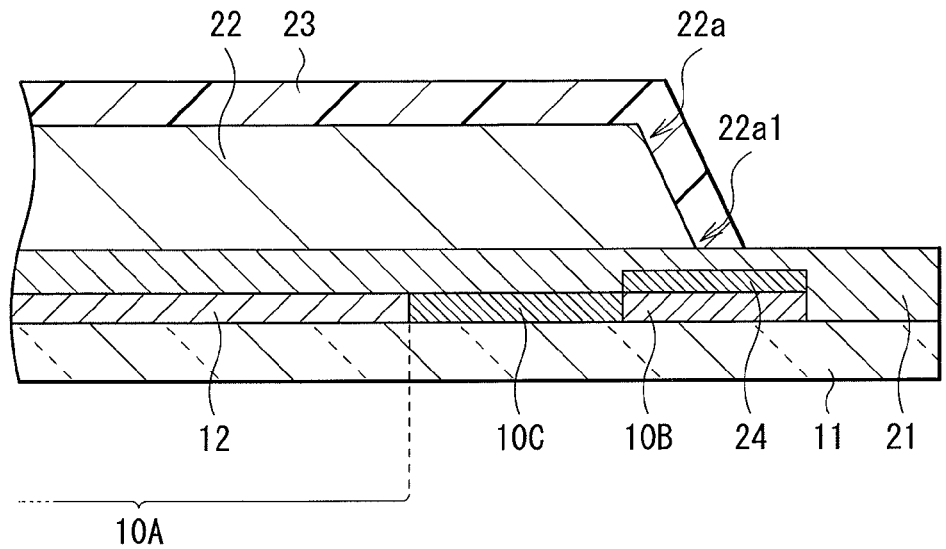
FIG. 9 is a schematic view showing a sectional structure of the periphery of a pixel section according to modification 2.

According to such a configuration, even in the embodiment, radiation is emitted from a not-shown radiation (for example, X-ray) source and passes through an object (a detection object). Then, a wavelength of the radiation is converted into a predetermined wavelength and then photoelectric conversion is performed on the wavelength-converted light, and thus an image of the object is produced as an electric signal, as in the first embodiment. Also in the embodiment, water tends to enter from an end 22a of the scintillator layer 22, leading to ionization of the scintillator layer 22, as described before. In the embodiment, the shield layer 24 is provided on the circuit section 10B, and thus even if such ionization occurs, ion migration is blocked by the shield layer 24, resulting in suppression of storage of fixed charge in the circuit section 10B. Consequently, the circuit section 10B is hardly affected by the ionization, leading to suppression of shift of the threshold voltage of the transistor in the section 10B. Moreover, the circuit section 10B may be disposed at any place unlike the first embodiment. For example, the circuit section 10B may be disposed to face a foot 22a1 of the end 22a of the scintillator layer 22 as shown in FIG. 9 (modification 2), in addition to the arrangement shown in FIGS. 8A and 8B. Alternatively, while not shown, the circuit section 10B may be disposed on an outer side from the foot 22a1 as in the first embodiment, or may be disposed on an inner side from the end 22a.

[Modification 3]

Figure 10:
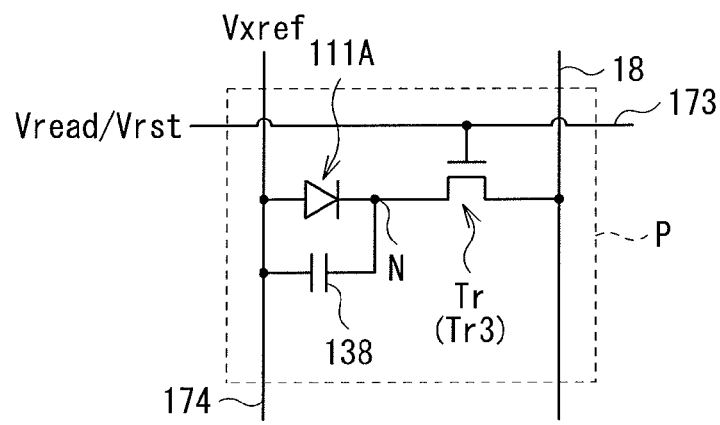
FIG. 10 shows an exemplary pixel circuit configuration (with a passive drive method) according to modification 3.

While the embodiment has been described with the exemplary pixel circuit configuration using an active drive method, a passive drive method as shown in FIG. 10 may be used. In the following, the same reference numerals are assigned to the same components as those in the above-described embodiments without duplicated explanation. In this modification, a unit pixel P includes a photodiode 111A, a capacitive component 138, and a transistor Tr (corresponding to the read transistor Tr3). The transistor Tr, which is connected between a storage node N and a vertical signal line 18, is turned on in response to a row scan signal Vread and thus outputs, to the vertical signal line 18, a signal charge stored in the storage node N corresponding to the quantity of light received by the photodiode 111A. In this way, the method of driving the pixels is not limited to the active drive method as described in the embodiments, and may be the passive drive method as in this modification.

[Application Example]

Figure 11:
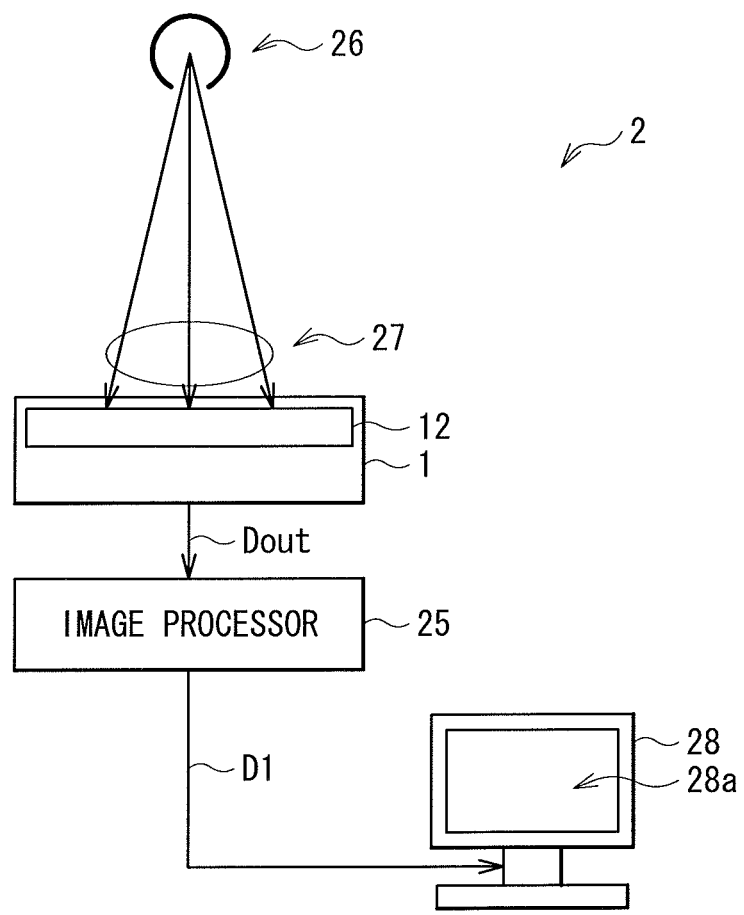
FIG. 11 is a schematic view showing a general configuration of a radiation image pickup/display system according to an application example.

The radiation image pickup apparatus 1 described in each of the first and second embodiments and the modification 1 may be applied to, for example, a radiation image pickup/display system 2 as shown in FIG. 11. The radiation image pickup/display system 2 includes the radiation image pickup apparatus 1, an image processor 25, and a display unit 28. According to such a configuration, in the radiation image pickup/display system 2, the radiation image pickup apparatus 1 acquires image data Dout of an object 27 on the basis of radiation emitted from an X-ray source 26 to the object 27, and outputs the data to the image processor 25. The image processor 25 performs predetermined image processing on the input image data Dout, and outputs the processed image data (display data D1) to the display unit 28. The display unit 28 has a monitor screen 28a, and displays image information on the monitor screen 28a on the basis of the input display data D1.

In this way, the radiation image pickup/display system 2 has the radiation image pickup apparatus 1 that may acquire the image of the object 27 as an electric signal, where the acquired electric signal is transmitted to the display unit 28 for image display. Specifically, the image of the object 27 may be viewed without using a radiation photographic film. This may be further applied to motion-picture photographing and motion-picture display.

While the disclosure has been described with several embodiments hereinbefore, the disclosure is not limited to the embodiments, and various modifications or alterations may be made. For example, while the embodiments and the like have been described with the exemplary case where the end 22a of the scintillator layer 22 has the tapered shape, the shape of the end 22a is not limited to this, and the end 22a may be perpendicular to a substrate surface or may be rounded.

In addition, the wavelength conversion material used for the scintillator layer 22 is not limited to that as described above, and any other phosphor material may be used.

Furthermore, while the photodiode 111A has a structure where the p-type semiconductor layer, the i-type semiconductor layer, and the n-type semiconductor layer are stacked in this order from a substrate side in the embodiments, the stacking order of the layers may be inversed.

In addition, the radiation image pickup apparatus according to the disclosure need not include all the components described in the embodiments. Conversely, the apparatus may have some other layer. For example, the apparatus may have a protective layer including SiN or the like on the upper electrode 125.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A radiation image pickup apparatus comprising:
a pixel section provided on a substrate and having photoelectric conversion elements;
a circuit section provided in the periphery of the pixel section and disposed on the substrate to drive the pixel section; and
a wavelength conversion layer provided on the pixel section to convert a wavelength of radiation into a predetermined wavelength within a sensitivity range of the photoelectric conversion elements,
wherein the circuit section is provided in a region not facing an end of the wavelength conversion layer in the periphery of the pixel section provided on the substrate.

2. The radiation image pickup apparatus according to claim 1, wherein a protective film is provided over the wavelength conversion layer.

3. The radiation image pickup apparatus according to claim 1, wherein the circuit section is disposed on an outer side from an end of the wavelength conversion layer.

4. The radiation image pickup apparatus according to claim 3,
wherein the end of the wavelength conversion layer has a tapered shape, and
the circuit section is disposed on an outer side from a foot of the tapered shape.

5. The radiation image pickup apparatus according to claim 1, wherein the circuit section is disposed on an inner side from the end of the wavelength conversion layer.

6. The radiation image pickup apparatus according to claim 1,
wherein the circuit section includes transistors each including a semiconductor layer, and
the semiconductor layer includes one of polycrystalline silicon, microcrystalline silicon, and oxide semiconductor.

7. The radiation image pickup apparatus according to claim 6, wherein the semiconductor layer includes low-temperature polycrystalline silicon.

8. The radiation image pickup apparatus according to claim 1, wherein a wiring layer is disposed between the pixel section and the circuit section.

9. A radiation image pickup apparatus comprising:
a pixel section provided on a substrate and having photoelectric conversion elements;
a circuit section provided in the periphery of the pixel section on the substrate to drive the pixel section;
a wavelength conversion layer provided on the pixel section to convert a wavelength of radiation into a certain wavelength within a sensitivity range of the photoelectric conversion elements; and
an electric shield layer provided on the circuit section.

10. The radiation image pickup apparatus according to claim 9, wherein a protective film is provided over the wavelength conversion layer.

11. The radiation image pickup apparatus according to claim 9,
wherein each of the photoelectric conversion elements has a semiconductor layer between a pair of conductive films, and
the electric shield layer is configured of the same material as that of one of the conductive films of the photoelectric conversion element.

12. The radiation image pickup apparatus according to claim 11, wherein the electric shield layer includes a transparent conductive film.

13. The radiation image pickup apparatus according to claim 9,
wherein the circuit section includes transistors each including a semiconductor layer, and
the semiconductor layer includes one of polycrystalline silicon, microcrystalline silicon, and oxide semiconductor.

14. The radiation image pickup apparatus according to claim 13, wherein the semiconductor layer includes low-temperature polycrystalline silicon.

15. A radiation image pickup/display system comprising:
an image pickup apparatus acquiring an image based on radiation; and
a display unit displaying an image acquired by the image pickup apparatus,
wherein the image pickup apparatus includes:
a pixel section provided on a substrate and having photoelectric conversion elements,
a circuit section provided in the periphery of the pixel section and disposed on the substrate to drive the pixel section, and
a wavelength conversion layer provided on the pixel section to convert a wavelength of radiation into a certain wavelength within a sensitivity range of the photoelectric conversion elements,
wherein the circuit section is provided in a region not facing an end of the wavelength conversion layer in the periphery of the pixel section provided on the substrate.

16. A radiation image pickup/display system comprising:
an image pickup apparatus acquiring an image based on radiation; and
a display unit displaying an image acquired by the image pickup apparatus,
wherein the image pickup apparatus includes:
a pixel section provided on a substrate and having photoelectric conversion elements,
a circuit section provided in the periphery of the pixel section on the substrate to drive the pixel section,
a wavelength conversion layer provided on the pixel section to convert a wavelength of radiation into a certain wavelength within a sensitivity range of the photoelectric conversion elements, and
an electric shield layer provided on the circuit section.

* * * * *